US012683603B2

(12) United States Patent
Wu et al.

(10) Patent No.: US 12,683,603 B2
(45) Date of Patent: Jul. 14, 2026

(54) SOURCE FOLLOWER CIRCUIT WITH FEEDBACK LOOP AND SELF-BIASED DIODE-CONNECTED METAL-OXIDE-SEMICONDUCTOR LOAD

(71) Applicant: Airoha Technology Corp., Hsinchu City (TW)

(72) Inventors: Chung-Ru Wu, Taoyuan City (TW); Min-Hua Wu, Hsinchu County (TW); Yi-Keng Hsieh, Hsinchu County (TW)

(73) Assignee: Airoha Technology Corp., Hsinchu City (TW)

( * ) Notice: Subject to any disclaimer, the term of this patent is extended or adjusted under 35 U.S.C. 154(b) by 9 days.

(21) Appl. No.: 18/826,142

(22) Filed: Sep. 5, 2024

(65) Prior Publication Data

US 2026/0066896 A1      Mar. 5, 2026

(51) Int. Cl.
*H03K 17/687*      (2006.01)
*H03H 7/06*      (2006.01)
(52) U.S. Cl.
CPC ........... *H03K 17/6871* (2013.01); *H03H 7/06* (2013.01)
(58) Field of Classification Search
CPC .............................. H03K 17/6871; H03H 7/06
USPC ........ 327/108, 427, 434, 389, 408, 437, 391
See application file for complete search history.

(56) References Cited

U.S. PATENT DOCUMENTS

| | | | |
|---|---|---|---|
| 9,893,728 B2 * | 2/2018 | Song | H03F 3/3033 |
| 2021/0152164 A1 | 5/2021 | He | |
| 2022/0103142 A1 | 3/2022 | Gruber | |
| 2025/0271885 A1 * | 8/2025 | Lu | G05F 1/468 |

FOREIGN PATENT DOCUMENTS

| | | |
|---|---|---|
| TW | 200840207 | 10/2008 |
| TW | 201918017 A | 5/2019 |
| WO | 2019/048065 A1 | 3/2019 |

OTHER PUBLICATIONS

Diksha Thakur et al., Low-power class-AB flipped source follower filter for voltage-sensitive applications, 2023 IEEE Devices for Integrated Circuit (DevIC), Apr. 7-8, 2023, Kalyani, India, pp. 383-386, XP034353075, Apr. 7, 2023.
(Continued)

*Primary Examiner* — Regis J Betsch
*Assistant Examiner* — Amit R Bhatia
(74) *Attorney, Agent, or Firm* — Winston Hsu

(57) ABSTRACT
A source follower circuit includes a first MOS transistor, a second MOS transistor, a third MOS transistor, and a feedback loop circuit. Regarding the first MOS transistor, a gate terminal receives an input signal of the source follower circuit, and a source terminal outputs an output signal of the source follower circuit. Regarding the second MOS transistor, a gate terminal is coupled to a bias voltage, a source terminal is coupled to a first reference voltage, and a drain terminal is coupled to the source terminal of the first MOS transistor. Regarding the third MOS transistor, it is a self-biased diode-connected MOS transistor with its gate terminal coupled to its drain terminal. The drain terminal of the third MOS transistor is coupled to a drain terminal of the first MOS transistor, and a source terminal of the third MOS transistor is coupled to a second reference voltage.

5 Claims, 4 Drawing Sheets

(56) References Cited

OTHER PUBLICATIONS

Lei Luo et al., A 0.2-2.5GHz Resistive Feedback LNA with Current Reuse Transconductance Boosting Technique in 0.18- μm CMOS, 2017 IEEE 15th Student Conference on Research and Development (SCOReD), pp. 424-427, XP033324928, 2017.

Lu, Y.; Chen, M.; Wang, K.; Yang, Y.; Wang, H., "A Capacitorless Flipped Voltage Follower LDO with Fast Transient Using Dynamic Bias", Electronics, MDPI, Electronics 2022, 11, 3009, pp. 1-13, Sep. 22, 2022.

* cited by examiner

SOURCE FOLLOWER CIRCUIT WITH FEEDBACK LOOP AND SELF-BIASED DIODE-CONNECTED METAL-OXIDE-SEMICONDUCTOR LOAD

BACKGROUND OF THE INVENTION

1. Field of the Invention

The present invention relates to a voltage buffer design, and more particularly, to a source follower circuit with at least one feedback loop and at least one self-biased diode-connected MOS (metal-oxide-semiconductor) load.

2. Description of the Prior Art

A typical source follower has high input impedance and low output impedance and can be used as a voltage buffer for driving a capacitive load. If a local negative feedback loop is adopted by the typical source follower, the output impedance can be lowered further, and this topology is usually called "flipped source follower". In addition, the feedback path may also enhance the output signal slew rate slightly. In the very first implementation, this local negative feedback loop is formed with a direct current (DC) coupling path, but this is not suitable for high-linearity application with modern advanced complementary metal-oxide-semiconductor (CMOS) process. To overcome this limitation and improve the bias flexibility, a local feedback path formed with a floating capacitor becomes popular. However, a DC bias of an internal node becomes unstable with such topology. Thus, there is a need for an innovative circuit design which provides a simple and power-efficiency way to address this issue.

SUMMARY OF THE INVENTION

One of the objectives of the claimed invention is to provide a source follower circuit with at least one feedback loop and at least one self-biased diode-connected MOS load.

According to a first aspect of the present invention, an exemplary source follower circuit is disclosed. The exemplary source follower circuit includes a first MOS transistor, a second MOS transistor, a third MOS transistor, and a feedback loop circuit. A gate terminal of the first MOS transistor is arranged to receive an input signal of the source follower circuit. A source terminal of the first MOS transistor is arranged to output an output signal of the source follower circuit. A gate terminal of the second MOS transistor is coupled to a bias voltage. A source terminal of the second MOS transistor is coupled to a first reference voltage. A drain terminal of the second MOS transistor is coupled to the source terminal of the first MOS transistor. The third MOS transistor is a self-biased diode-connected MOS transistor. A gate terminal of the third MOS transistor is coupled to a drain terminal of the third MOS transistor. The drain terminal of the third MOS transistor is coupled to a drain terminal of the first MOS transistor. A source terminal of the third MOS transistor is coupled to a second reference voltage. The feedback loop circuit is coupled between the drain terminal of the first MOS transistor and the gate terminal of the second MOS transistor.

According to a second aspect of the present invention, an exemplary flipped source follower circuit is disclosed. The exemplary flipped source follower circuit includes a first MOS transistor, a second MOS transistor, and a low-pass filter. A gate terminal of the first MOS transistor is arranged to receive an input signal of the flipped source follower circuit. A source terminal of the first MOS transistor is arranged to output an output signal of the flipped source follower circuit. A drain terminal of the second MOS transistor is coupled to a drain terminal of the first MOS transistor. A source terminal of the second MOS transistor is coupled to a reference voltage. An input node of the low-pass filter is coupled to the drain terminal of the second MOS transistor, and an output node of the low-pass filter is coupled to a gate terminal of the second MOS transistor.

According to a third aspect of the present invention, an exemplary flipped source follower circuit is disclosed. The exemplary flipped source follower circuit includes a first MOS transistor, a second MOS transistor, a third MOS transistor, a fourth MOS transistor, a resistor, and another resistor. A gate terminal of the first MOS transistor is arranged to receive an input signal of the flipped source follower circuit. A source terminal of the first MOS transistor is arranged to output an output signal of the flipped source follower circuit. A drain terminal of the second MOS transistor is coupled to a drain terminal of the first MOS transistor. A source terminal of the second MOS transistor is coupled to a reference voltage. A gate terminal of the third MOS transistor is arranged to receive another input signal of the flipped source follower circuit. A source terminal of the third MOS transistor is arranged to output another output signal of the flipped source follower circuit. The input signal and the another input signal are a differential input. The output signal and the another output signal are a differential output. A gate terminal of the fourth MOS transistor is coupled to a gate terminal of the second MOS transistor. A drain terminal of the fourth MOS transistor is coupled to a drain terminal of the third MOS transistor. A source terminal of the fourth MOS transistor is coupled to the reference voltage. The resistor is coupled between the drain terminal and the gate terminal of the second MOS transistor. The another resistor is coupled between the drain terminal and the gate terminal of the fourth MOS transistor.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . .". Also, the term "couple" is intended to mean either an indirect or direct electrical connection. Accordingly, if one device is coupled to another device, that connection may be through a direct electrical connection, or through an indirect electrical connection via other devices and connections.

Figure 1:
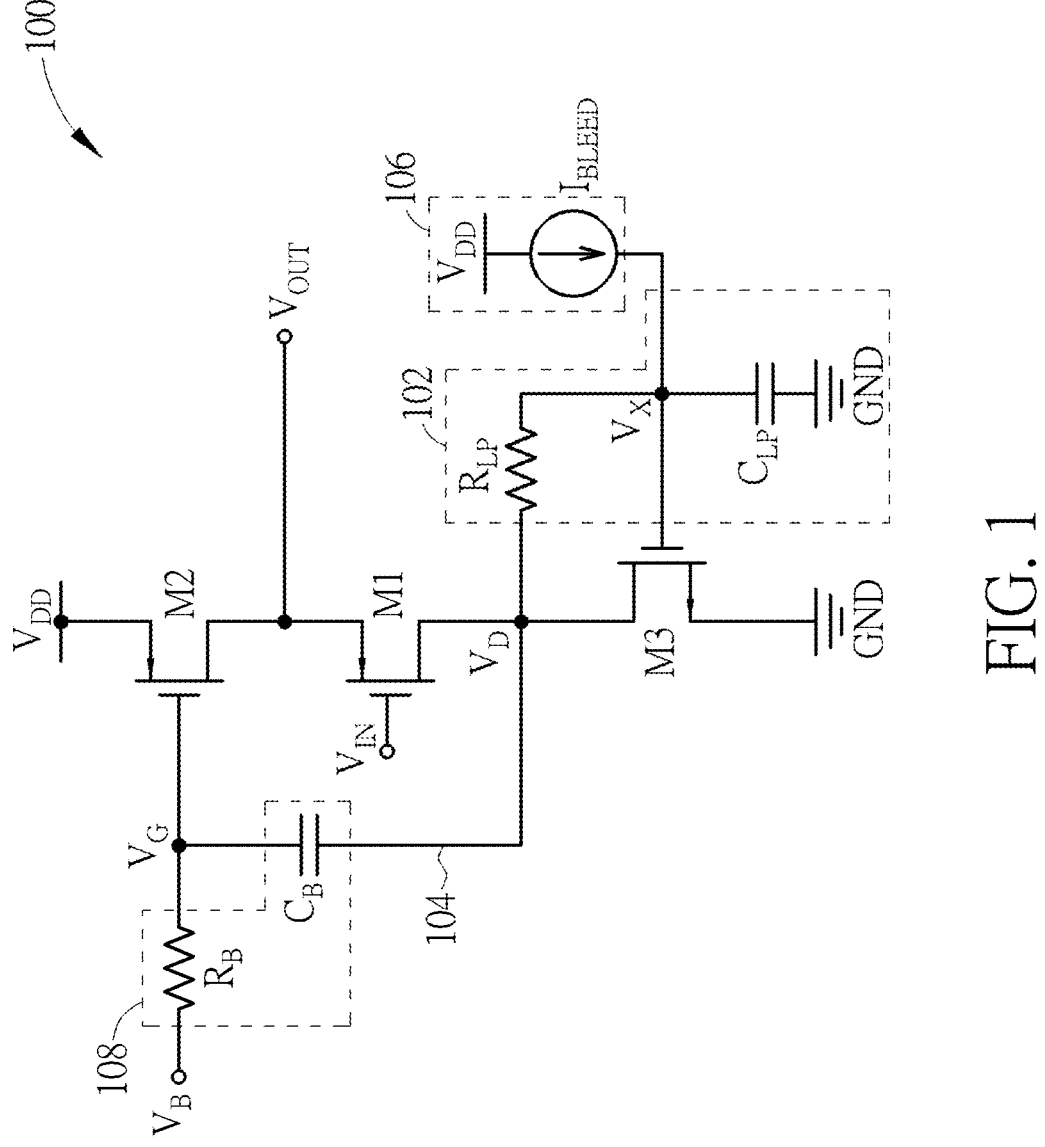
FIG. 1 is a circuit diagram of a source follower circuit with first single-ended topology according to an embodiment of the present invention.

FIG. 1 is a circuit diagram of a source follower circuit with first single-ended topology according to an embodiment of the present invention. The source follower circuit 100 may be used as a voltage buffer for driving a capacitive load such as a capacitor of a sampler. As shown in FIG. 1, the source follower circuit 100 includes a plurality of MOS transistors M1, M2, M3, a low-pass filter 102, a feedback loop circuit 104, and a reference current generator circuit 106. In this embodiment, each of the MOS transistors M1 and M2 is a P-channel metal-oxide-semiconductor (PMOS) transistor, and the MOS transistor M3 is an N-channel metal-oxide-semiconductor (NMOS) transistor. Regarding the MOS transistor M1, the gate terminal is arranged to receive an input signal VIN (which is a single-ended voltage input) of the source follower circuit 100, and the source terminal is arranged to output an output signal Vour (which is a single-ended voltage output) of the source follower circuit 100. Regarding the MOS transistor M2, the gate terminal is coupled to a bias voltage $V_B$ via a resistor Re, the source terminal is coupled to a first reference voltage (e.g., supply voltage $V_{DD}$), and the drain terminal is coupled to the source terminal of the MOS transistor M1. In this embodiment, the MOS transistor M3 is a self-biased diode-connected MOS transistor (i.e., self-biased diode-connected MOS load), where the gate terminal of the MOS transistor M3 is coupled to the drain terminal of the MOS transistor M3. In addition, the drain terminal of the MOS transistor M3 is coupled to the drain terminal of the MOS transistor M1, and the source terminal of the MOS transistor M3 is coupled to a second reference voltage (e.g., ground voltage GND, where GND<$V_{DD}$).

In this embodiment, the source follower circuit 100 is based on a flipped source follower structure which offers low output impedance, low noise and high linearity, and therefore adopts the feedback loop circuit 104 to provide an alternating current (AC) coupled feedback path. As shown in FIG. 1, the feedback loop circuit 104 is implemented using a capacitor CB, and a high-pass filter 108 is formed by the resistor Re and the capacitor CB. The DC level of the gate voltage VG of the MOS transistor M2 is set by the bias voltage $V_B$.

The major difference between the proposed source follower circuit 100 and a typical flipped source follower circuit is that the proposed source follower circuit 100 uses a self-biased diode-connected MOS load (which is implemented by the MOS transistor M3) for setting a DC level of the drain voltage $V_D$ (i.e., DC bias at drain terminal) of the MOS transistor M1 (which is an input transistor). Specifically, the MOS transistor M3 operates in a saturation region, and the gate voltage $V_X$ of the MOS transistor M3 has a constant DC value that is equal to the gate-to-source voltage of the MOS transistor M3. Hence, the DC level of the drain voltage $V_D$ of the MOS transistor M1 is constant due to the constant DC level of the gate voltage $V_X$ of the MOS transistor M3.

In this embodiment, the low-pass filter 102 may include a large-sized resistor Rup and a large-sized capacitor $C_{LP}$, where the resistor Rup is coupled between the drain terminal and the gate terminal of the MOS transistor M3, and the capacitor Cup is coupled between the gate terminal of the MOS transistor M3 and the second reference voltage (e.g., ground voltage GND). Specifically, an input node of the low-pass filter 102 is coupled to the drain terminal of the MOS transistor M3, and an output node of the low-pass filter 102 is coupled to the gate terminal of the MOS transistor M3. The gate voltage $V_X$ of the MOS transistor M3 is AC-grounded due to AC-coupling provided by the capacitor Cip. That is, the gate terminal of the MOS transistor M3 acts as an AC ground for AC signal components. In this way, the drain voltage Vp has a stable DC level at low frequency.

The source follower circuit 100 may be used in a high-speed receiver. The resistor Rup can provide high impedance at high frequency. In this way, high-frequency signal components at the drain terminal of the MOS transistor M1 pass through the feedback loop circuit 104, which avoids degradation of the local feedback loop gain. Since the feedback loop circuit 104 has high feedback loop gain, it can lower the output impedance of the source follower circuit 100 effectively.

As mentioned above, the DC level of the drain voltage $V_D$ is set by the DC level of the gate voltage $V_X$ of the MOS transistor M3, where the DC level of the drain voltage $V_D$ is equal to the gate-to-source voltage of the MOS transistor M3. In some embodiments, the gate-to-source voltage of the MOS transistor M3 may be 0.4V-0.45V. When the source follower circuit 100 is used by a low-power receiver with a low supply voltage. The DC bias at the drain terminal of the MOS transistor M1 may be too high, resulting in a smaller output voltage swing range due to a smaller drain-to-source voltage range of the MOS transistor M1. To enhance the linearity performance and the driving capability, the present invention proposes adding the reference current generator circuit 106 to the source follower circuit 100. For example, the reference current generator circuit 106 may be implemented using a current source. For another example, the reference current generator circuit 106 may be implemented using a voltage source and a resistor.

As shown in FIG. 1, the reference current generator circuit 106 is coupled to the gate terminal of the MOS transistor M3, and arranged to generate a reference current $I_{BLEED}$ flowing through the resistor $R_{LP}$. In this embodiment, the reference current $I_{BLEED}$ is a source current injected into the resistor Rup, thereby making a drain voltage of the MOS transistor M3 (which is also the drain voltage $V_D$ of the MOS transistor M1) lower than the gate voltage $V_X$ of the MOS transistor M3. Specifically, $V_D=V_X-I_{BLEED}\times R_{LP}$. Since the DC level of the drain voltage $V_D$ of the MOS transistor M1 is lowered, the drain-to-source voltage range of the MOS transistor M1 is increased. In this way, the output voltage swing range of the source follower circuit 100 is increased.

In this embodiment, the source follower circuit 100 is a flipped source follower circuit with a local feedback loop, and adopts a plurality of proposed techniques to realize a high-speed, low-voltage, low-power, high-linearity source follower circuit. For example, the proposed techniques adopted by the source follower circuit 100 include using a self-biased diode-connected MOS transistor M3 to determine the DC bias at the drain terminal of the MOS transistor M1, using an AC ground (which is provided through capacitor Cip) to ensure a regulated DC level of the drain voltage $V_D$ at low frequency, using high impedance (which is provided through resistor $R_{LP}$) to ensure a high local feedback loop gain at high frequency, and using a source current (which is provided through reference current generator circuit 106) injected into resistor $R_{LP}$ to increase an output voltage swing range. However, this is for illustrative purposes only, and is not meant to be a limitation of the present invention. In practice, any source follower circuit (particularly, any flipped source follower circuit with a local feedback loop) that adopts one or some of the proposed techniques still falls within the scope of the present invention.

To put it simply, the proposed topology uses simple circuit components without a complex operational amplifier, to define the DC bias voltage of a source follow circuit with a high local feedback loop gain while only occupying low voltage headroom in tandem. With the help of an additional source current, the source follow circuit with low output impedance can have an enlarged output voltage swing range for high linearity performance. Because of this simple, compact, and low-power design, this topology may be suitable for a multi-channel analog-to-digital converter (ADC) application in which an ADC array is driven by multiple source follow circuits in parallel for time-interleaving analog-to-digital conversion.

Figure 2:
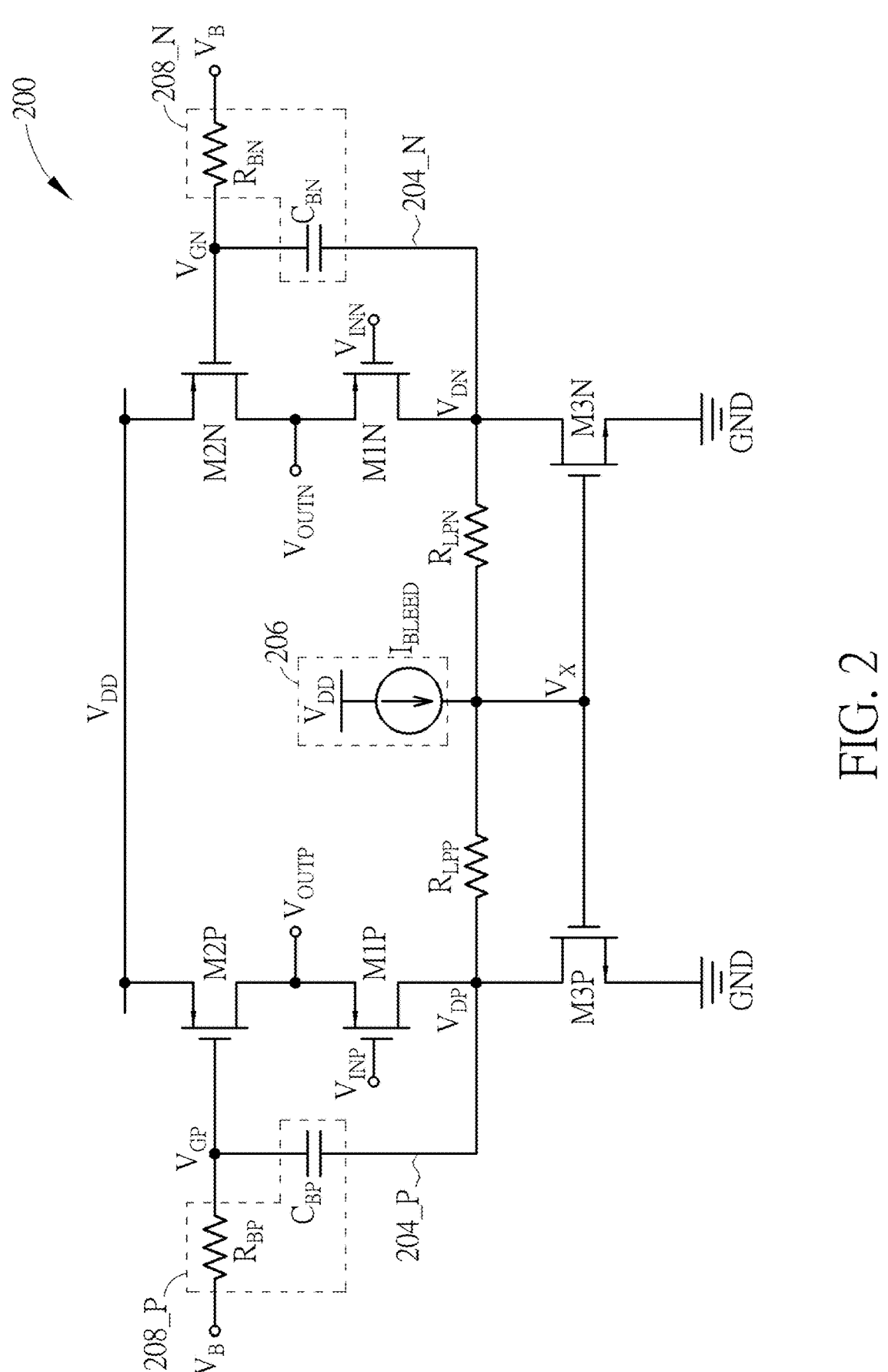
FIG. 2 is a circuit diagram of a source follower circuit with first fully-differential topology according to an embodiment of the present invention.

The source follower circuit 100 shown in FIG. 1 has single-ended topology. However, the proposed techniques can also be adopted in a source follower circuit with fully-differential topology. FIG. 2 is a circuit diagram of a source follower circuit with first fully-differential topology according to an embodiment of the present invention. The source follower circuit 200 may be used as a voltage buffer for driving a capacitive load such as a capacitor of a sampler. As shown in FIG. 2, the source follower circuit 200 includes a plurality of MOS transistors M1P, M1N, M2P, M2N, M3P, M3N, a plurality of resistors $R_{LPP}$, $R_{LPN}$, a plurality of feedback loop circuits 204_P, 204_N, and a reference current generator circuit 206. In this embodiment, each of the MOS transistors M1P, M2P, M1N, and M2N is a PMOS transistor, and each of the MOS transistors M3P and M3N is an NMOS transistor.

Regarding the MOS transistor M1P, the gate terminal is arranged to receive one input signal $V_{INP}$ of the source follower circuit 200, and the source terminal is arranged to output one output signal $V_{OUTP}$ of the source follower circuit 200. Regarding the MOS transistor M1N, the gate terminal is arranged to receive another input signal $V_{INN}$ of the source follower circuit 200, and the source terminal is arranged to output another output signal $V_{OUTN}$ of the source follower circuit 200. The input signals $V_{INP}$ and $V_{INN}$ are a differential voltage input of the source follower circuit 200. The output signals $V_{OUTP}$ and $V_{OUTN}$ are a differential voltage output of the source follower circuit 200.

Regarding the MOS transistor M2P, the gate terminal is coupled to a bias voltage $V_B$ via a resistor $R_{BP}$, the source terminal is coupled to a first reference voltage (e.g., supply voltage $V_{DD}$), and the drain terminal is coupled to the source terminal of the MOS transistor M1P. Regarding the MOS transistor M2N, the gate terminal is coupled to the bias voltage $V_B$ via a resistor Ren, the source terminal is coupled to the first reference voltage (e.g., supply voltage $V_{DD}$), and the drain terminal is coupled to the source terminal of the MOS transistor M1N.

In this embodiment, each of the MOS transistors M3P and M3N is a self-biased diode-connected MOS transistor, where the gate terminal of the MOS transistor M3P is coupled to the drain terminal of the MOS transistor M3P, and the gate terminal of the MOS transistor M3N is coupled to the drain terminal of the MOS transistor M3N. In accordance with the fully-differential topology, gate terminals of the MOS transistors M3P and M3N are connected to each other to form a virtual ground. Specifically, the gate voltage $V_X$ is generated at a node which is an AC ground for AC signal components due to inherent characteristics of the fully-differential topology. Hence, the capacitor Cup used in the single-ended topology may be omitted in the fully-differential topology.

In addition, the drain terminal of the MOS transistor M3P is coupled to the drain terminal of the MOS transistor MIP, the source terminal of the MOS transistor M3P is coupled to a second reference voltage (e.g., ground voltage GND, where GND<$V_{DD}$), the drain terminal of the MOS transistor M3N is coupled to the drain terminal of the MOS transistor M1N, and the source terminal of the MOS transistor M3N is coupled to the second reference voltage (e.g., ground voltage GND).

Like the source follower circuit 100 shown in FIG. 1, the source follower circuit 200 is based on a flipped source follower structure which offers low output impedance and separates the noise performance and the in-band linearity. As shown in FIG. 2, the source follower circuit 200 adopts feedback loop circuits 204_P and 204_N to provide AC coupled feedback paths, respectively. The feedback loop circuit 204_P is implemented using a capacitor Cep, and a high-pass filter 208_P is formed by the resistor Rep and the capacitor CBP. The feedback loop circuit 204_N is implemented using a capacitor CEN, and a high-pass filter 208_N is formed by the resistor REN and the capacitor CEN. The DC level of the gate voltage $V_{GP}$ of the MOS transistor M2P is set by the bias voltage Ve. The DC level of the gate voltage $V_{GN}$ of the MOS transistor M2N is also set by the bias voltage $V_B$.

The proposed source follower circuit 200 uses one self-biased diode-connected MOS load (which is implemented by MOS transistor M3P) for setting a DC level of the drain voltage $V_{DP}$ (i.e., DC bias at drain terminal) of the MOS transistor M1P (which is one input transistor), and uses another self-biased diode-connected MOS load (which is implemented by MOS transistor M3N) for setting a DC level of the drain voltage $V_{DN}$ (i.e., DC bias at drain terminal) of the MOS transistor M1N (which is another input transistor). Specifically, each of the MOS transistors M3P and M3N operates in a saturation region, and the gate voltage $V_X$ of the MOS transistors M3P and M3N has a constant the DC value that is equal to the gate-to-source voltage of the MOS transistors M3P and M3N. Hence, the DC level of the drain voltage $V_{DP}$ of the MOS transistor MIP has a constant value due to the DC level of the gate voltage $V_X$, and the DC level of the drain voltage $V_{DN}$ of the MOS transistor M1N has a constant value due to the DC level of the gate voltage $V_X$.

The gate voltage $V_X$ of the MOS transistors M3P and M3N is generated at a node which is an AC ground for AC signal components due to inherent characteristics of the fully-differential topology. In this way, each of the drain voltages $V_{DP}$ and $V_{DN}$ has a stable DC level at low frequency. The source follower circuit 200 may be used in a high-speed receiver. Each of the resistors $R_{LPP}$ and $R_{LPN}$ can provide high impedance at high frequency. In this way, high-frequency signal components at the drain terminal of the MOS transistor M1P pass through the feedback loop circuit 204_P and high-frequency signal components at the drain terminal of the MOS transistor M1N pass through the feedback loop circuit 204_N, which avoids degradation of the local feedback loop gain. Since both of the feedback loop circuits 204_P and 204_N have high feedback loop gain, they can lower the output impedance of the source follower circuit 200 effectively.

As mentioned above, the DC level of each of the drain voltages $V_{DP}$ and $V_{DN}$ is set based on the DC level of the gate voltage $V_X$ (which is set by the gate-to-source voltage of the MOS transistors M3P and M3N). In some embodiments, the gate-to-source voltage of the MOS transistors M3P and M3N may be 0.4V-0.45V approximately. When the source follower circuit 200 is used by a low-power receiver with a low supply voltage, the DC bias at drain terminals of MOS transistors M1P and M1N may be too high, resulting in a smaller output voltage swing range due to a smaller drain-to-source voltage range of the MOS transistors M1P and M1N. To enhance the linearity performance and the driving capability, the present invention proposes adding the reference current generator circuit 206 to the source follower circuit 200. For example, the reference current generator circuit 206 may be implemented using a current source. For another example, the reference current generator circuit 206 may be implemented using a voltage source and a resistor.

As shown in FIG. 2, the reference current generator circuit 206 is coupled to the gate terminals of the MOS transistors M3P and M3N, and arranged to generate a reference current $I_{BLEED}$, where a first reference current $$\frac{I_{BLEED}}{2}$$

flows through the resistor Rupp, and a second reference current $$\frac{I_{BLEED}}{2}$$

flows through the resistor $R_{LPN}$. In this embodiment, the reference current $I_{BLEED}$ is a source current that makes a drain voltage of the MOS transistor M3P (which is also the drain voltage $V_{DP}$ of the MOS transistor M1P) lower than the gate voltage $V_X$ of the MOS transistor M3P, and also makes a drain voltage of the MOS transistor M3N (which is also the drain voltage $V_{DN}$ of the MOS transistor M1N) lower than the gate voltage $V_X$ of the MOS transistor M3N. Specifically, $$V_{DP} = V_X - \frac{I_{BLEED}}{2} \times R_{LPP}, \text{ and } V_{DN} = V_X - \frac{I_{BLEED}}{2} \times R_{LPN}.$$

Since the DC level of the drain voltage $V_{DP}$ of the MOS transistor M1P is lowered, the drain-to-source voltage range of the MOS transistor M1P is increased. Similarly, since the DC level of the drain voltage $V_{DN}$ of the MOS transistor M1N is lowered, the drain-to-source voltage range of the MOS transistor M1N is increased. In this way, the output voltage swing range of the source follower circuit 200 is increased.

In this embodiment, the source follower circuit 200 is a flipped source follower circuit with a local feedback loop, and adopts a plurality of proposed techniques to realize a high-speed, low-voltage, low-power, high-linearity source follower circuit. For example, the proposed techniques adopted by the source follower circuit 200 include using self-biased diode-connected MOS transistors M3P and M3N to determine the DC bias of the MOS transistors M1P and M1N, using an AC ground (which is provided through virtual ground at gate terminals of MOS transistors M3P and M3N) to ensure regulated DC levels of the drain voltages $V_{DP}$ and $V_{DN}$ at low frequency, using high impedance (which is provided through resistors $R_{LPP}$ and $R_{LPN}$) to ensure high local feedback loop gains at high frequency, and using source currents (which are provided through reference current generator circuit 206) injected into resistors $R_{LPP}$ and $R_{LPN}$ to increase an output voltage swing range. However, this is for illustrative purposes only, and is not meant to be a limitation of the present invention. In practice, any source follower circuit (particularly, any flipped source follower circuit with a local feedback loop) that adopts one or some of the proposed techniques still falls within the scope of the present invention.

In the embodiment shown in FIG. 1, the MOS transistors M1 and M2 are PMOS transistors, and the MOS transistor M3 is an NMOS transistor. In some embodiments of the present invention, the proposed techniques can also be adopted in an alternative source follower design having the MOS transistors M1 and M2 implemented using NMOS transistors and the MOS transistor M3 implemented using a PMOS transistor.

Figure 3:
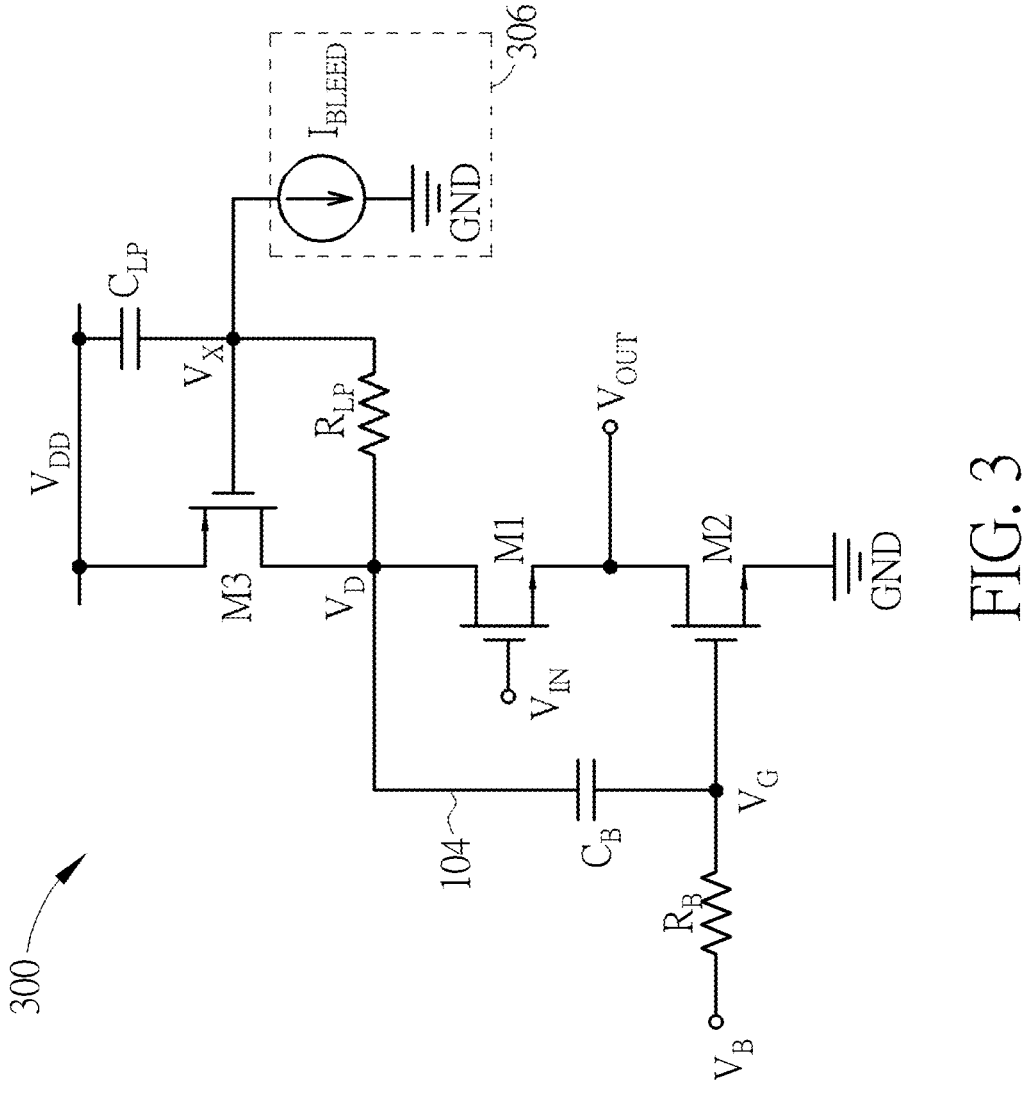
FIG. 3 is a circuit diagram of a source follower circuit with second single-ended topology according to an embodiment of the present invention.

FIG. 3 is a circuit diagram of a source follower circuit with second single-ended topology according to an embodiment of the present invention. Regarding the source follower circuit 300, each of the MOS transistors M1 and M2 is an NMOS transistor, and the MOS transistor M3 is a PMOS transistor. The source terminal of the MOS transistor M3 is coupled to a first reference voltage (e.g., supply voltage $V_{DD}$). The source terminal of the MOS transistor M2 is coupled to a second reference voltage (e.g., ground voltage GND, where GND<$V_{DD}$). As shown in FIG. 3, a reference current generator circuit 306 is coupled to the gate terminal of the MOS transistor M3, and arranged to generate a reference current $I_{BLEED}$ flowing through the resistor $R_{LP}$. Since the self-biased diode-connected MOS load is implemented by a PMOS transistor, the reference current $I_{BLEED}$ is a sink current that makes a drain voltage of the MOS transistor M3 (which is also the drain voltage $V_D$ of the MOS transistor M1) higher than the gate voltage $V_X$ of the MOS transistor M3. Specifically, $V_D = V_X + I_{BLEED} \times R_{LP}$. Since the DC level of the drain voltage $V_D$ of the MOS transistor M1 is increased, the drain-to-source voltage range of the MOS transistor M1 is increased, and the output voltage swing range of the source follower circuit 300 is increased.

In this embodiment, the source follower circuit 300 is a flipped source follower circuit with a local feedback loop, and adopts a plurality of proposed techniques to realize a high-speed, low-voltage, low-power, high-linearity source follower circuit. For example, the proposed techniques adopted by the source follower circuit 300 include using a self-biased diode-connected MOS transistor M3 to determine the DC bias of the MOS transistor M1, using an AC ground (which is provided through capacitor $C_{LP}$) to ensure a regulated DC level of the drain voltage $V_D$ at low frequency, using high impedance (which is provided through resistor $R_{LP}$) to ensure a high local feedback loop gain at high frequency, and using a sink current (which is provided through reference current generator circuit 306) drained from resistor Rup to increase an output voltage swing range. However, this is for illustrative purposes only, and is not meant to be a limitation of the present invention. In practice, any source follower circuit (particularly, any flipped source follower circuit with a local feedback loop) that adopts one or some of the proposed techniques still falls within the scope of the present invention.

In the embodiment shown in FIG. 2, the MOS transistors M1P, M1N, M2P, and M2N are PMOS transistors, and the MOS transistors M3P and M3N are NMOS transistors. In some embodiments of the present invention, the proposed techniques can also be adopted in an alternative source follower design having the MOS transistors M1P, M1N, M2P, and M2N implemented using NMOS transistors and the MOS transistors M3P and M3N implemented using PMOS transistors.

Figure 4:
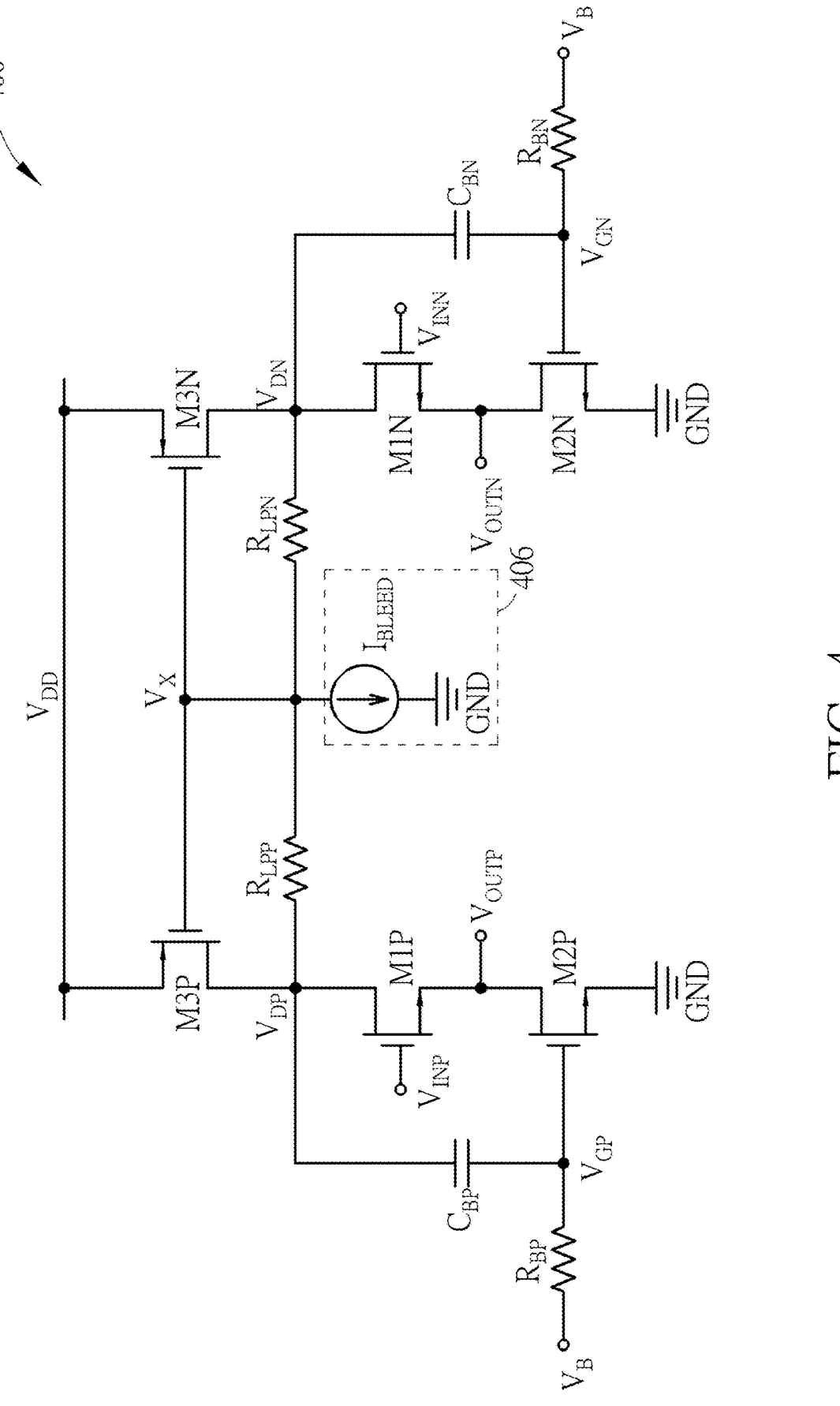
FIG. 4 is a circuit diagram of a source follower circuit with second fully-differential topology according to an embodiment of the present invention.

FIG. 4 is a circuit diagram of a source follower circuit with second fully-differential topology according to an embodiment of the present invention. Regarding the source follower circuit 400, the MOS transistors M1P, M1N, M2P, and M2N are NMOS transistors, and the MOS transistors M3P and M3N are PMOS transistor. The source terminals of MOS transistors M3P and M3N are coupled to a first reference voltage (e.g., supply voltage $V_{DD}$). The source terminals of MOS transistors M2P and M2N are coupled to a second reference voltage (e.g., ground voltage GND, where GND<$V_{DD}$). As shown in FIG. 4, a reference current generator circuit 406 is coupled to the gate terminals of the MOS transistors M3P and M3N, and arranged to generate a reference current $I_{BLEED}$, where a first reference current $I_{BLEED}/2$ flowing through the resistor Rupp, and a second reference current $I_{BLEED}/2$ flowing through the resistor $R_{LPN}$. Since the self-biased diode-connected MOS loads are implemented by PMOS transistors, the reference current $I_{BLEED}$ is a sink current that makes a drain voltage of the MOS transistor M3P (which is also the drain voltage $V_{DP}$ of the MOS transistor M1P) higher than the gate voltage $V_X$ of the MOS transistor M3P, and also makes a drain voltage of the MOS transistor M3N (which is also the drain voltage $V_{DN}$ of the MOS transistor M1N) higher than the gate voltage $V_X$ of the MOS transistor M3N. Specifically, $$V_{DP} = V_X + \frac{I_{BLEED}}{2} \times R_{LPP} \text{ and } V_{DN} = V_X + \frac{I_{BLEED}}{2} \times R_{LPN}.$$

Since the DC level of the drain voltage $V_{DP}$ of the MOS transistor M1P is increased, the drain-to-source voltage range of the MOS transistor MIP is increased. Similarly, since the DC level of the drain voltage $V_{DN}$ of the MOS transistor M1N is increased, the drain-to-source voltage range of the MOS transistor M1N is increased. In this way, the output voltage swing range of the source follower circuit 400 is increased.

In this embodiment, the source follower circuit 400 is a flipped source follower circuit with a local feedback loop, and adopts a plurality of proposed techniques to realize a high-speed, low-voltage, low-power, high-linearity source follower circuit. For example, the proposed techniques adopted by the source follower circuit 400 include using self-biased diode-connected MOS transistors M3P and M3N to determine the DC bias of the MOS transistors M1P and M1N, using an AC ground (which is provided through virtual ground at gate terminals of MOS transistors M3P and M3N) to ensure regulated DC levels of the drain voltages $V_{DP}$ and $V_{DN}$ at low frequency, using high impedance (which is provided through resistors $R_{LPP}$ and $R_{LPN}$) to ensure high local feedback loop gains at high frequency, and using sink currents (which are provided through reference current generator circuit 406) drained from resistors $R_{LPP}$ and $R_{LPN}$ to increase an output voltage swing range. However, this is for illustrative purposes only, and is not meant to be a limitation of the present invention. In practice, any source follower circuit (particularly, any flipped source follower circuit with a local feedback loop) that adopts one or some of the proposed techniques still falls within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A source follower circuit comprising:
   a first metal-oxide-semiconductor (MOS) transistor, wherein a gate terminal of the first MOS transistor is arranged to receive an input signal of the source follower circuit, and a source terminal of the first MOS transistor is arranged to output an output signal of the source follower circuit;
   a second MOS transistor, wherein a gate terminal of the second MOS transistor is coupled to a bias voltage, a source terminal of the second MOS transistor is coupled to a first reference voltage, and a drain terminal of the second MOS transistor is coupled to the source terminal of the first MOS transistor;
   a third MOS transistor, wherein the third MOS transistor is a self-biased diode-connected MOS transistor, a gate terminal of the third MOS transistor is coupled to a drain terminal of the third MOS transistor, the drain terminal of the third MOS transistor is coupled to a drain terminal of the first MOS transistor, and a source terminal of the third MOS transistor is coupled to a second reference voltage;
   a feedback loop circuit, coupled between the drain terminal of the first MOS transistor and the gate terminal of the second MOS transistor; and
   a resistor, coupled between the drain terminal and the gate terminal of the third MOS transistor.

2. The source follower circuit of claim 1, further comprising:
   a reference current generator circuit, coupled to the gate terminal of the third MOS transistor and arranged to generate a reference current flowing through the resistor.

3. The source follower circuit of claim 2, wherein each of the first MOS transistor and the second MOS transistor is a P-channel MOS transistor, the third MOS transistor is an N-channel MOS transistor, and the reference current is a source current that makes a drain voltage of the third MOS transistor lower than a gate voltage of the third MOS transistor.

4. The source follower circuit of claim 2, wherein the first reference voltage is higher than the second reference voltage, and the reference current is a source current that makes a drain voltage of the third MOS transistor lower than a gate voltage of the third MOS transistor.

5. The source follower circuit of claim 1, further comprising:
   a capacitor, coupled between the gate terminal of the third MOS transistor and the second reference voltage.

* * * * *